United States Patent [19]

Hui et al.

[11] Patent Number: 5,359,538
[45] Date of Patent: Oct. 25, 1994

[54] METHOD FOR REGULAR PLACEMENT OF DATA PATH COMPONENTS IN VLSI CIRCUITS

[75] Inventors: Siu-Tong Hui, San Jose; Dale M. Wong, San Francisco, both of Calif.

[73] Assignee: VLSI Technology, Inc., San Jose, Calif.

[21] Appl. No.: 747,541

[22] Filed: Aug. 20, 1991

[51] Int. Cl.$^5$ ............................................. G06F 15/60
[52] U.S. Cl. .................................. 364/491; 364/490; 364/489; 364/488
[58] Field of Search ................. 364/488, 489, 490, 491

[56] References Cited

U.S. PATENT DOCUMENTS

| | | | |
|---|---|---|---|
| 5,202,840 | 4/1993 | Wong | 364/490 |
| 5,222,031 | 6/1993 | Kaida | 364/491 |
| 5,229,953 | 7/1993 | Isozaki et al. | 364/490 |

OTHER PUBLICATIONS

"Multi-Terrain Partitionary and Flood-Planning for Data-Path chip (Microprocessor) Layout" by Wing K. Luk et al., IEEE 26th ACM Design Automation Conference, Jun. 1989, pp. 492-494.

C. M. Fiduccia and R. M. Mattheyses, *A Linear-Time Heuristic for Improving Network Partitions* Proceedings of the 19th Design Automation Conference, 1982, pp. 241-247.

Maurice Hanan, Peter K. Wolff, Sr. and Barbara J. Agule, *Some Experimental Results of Placement Techniques,* Proceedings of the 13th Design Automation Conf., 1976, pp. 214-224.

Carl Sechen and Alberto Sangiovanni-Vincentelli, *The Timber Wolf Placement and Routing Package,* IEEE Journal of Solid-State Circuits, 1985, pp. 510-522.

Gotaro Odawara, Takahisa Hiraide, and Osamu Nishina, *Partitioning and Placement Technique for CMOS Gate Arrays,* IEEE Transactions on Computer-aided Design, 1987, pp. 355-363.

*Primary Examiner*—Vincent N. Trans
*Attorney, Agent, or Firm*—Douglas L. Weller

[57] ABSTRACT

In a method for placement of components for a VLSI circuit, control signal connection networks and data signal connection networks are identified. Then, an initial placement of the components for the VLSI circuit is made. This initial placement is iteratively improved. The algorithm used for the iterative improvement has a cost metric in which a horizontal component for length of a connection network and a vertical component for length of the connection network are weighted differently dependent on whether the connection network was identified as a control signal connection network or a data signal connection network. The different weighting results in improved regularity of the placement of data path components and thus a more efficient routing of connection networks between the components.

10 Claims, 2 Drawing Sheets

METHOD FOR REGULAR PLACEMENT OF DATA PATH COMPONENTS IN VLSI CIRCUITS

BACKGROUND

The present invention concerns the placement of components so as to regularize the location of data paths in very large scale integrated (VLSI) circuits.

In the design of integrated circuits, circuitry consists of functional blocks of logic, often called components, which are interconnected by connection lines. In data path circuits, these connection lines include connection lines on which are placed data signals, called data signal connection networks, and connection lines on which are placed control signals, called control signal connection networks.

One approach for laying out the circuitry of complex VLSI circuits is the use of a hierarchical layout design. In such an approach the components are first partitioned into clusters. For an example of a prior method for partitioning components into clusters see, for example, C. M. Fiduccia and R. M. Mattheyses, *A Linear-Time Heuristic for Improving Network Partitions*, Proceedings of the 19th Design Automation Conference, 1982, pp. 241-247.

Once partitioned, a global placement algorithm is used to place the clusters in locations on the circuit. After placement of clusters, detail placement algorithms are used to place individual components within each cluster. After an initial placement of clusters and components, placement improvement algorithms may be used to optimize the placement of components within the clusters. Once the clusters and components have been placed, connection line routers are used to route connection line networks between the components. For examples of other placement techniques, see generally, Maurice Hanan, Peter K. Wolff, Sr. and Barbara J. Agule, *Some Experimental Results of Placement Techniques*, Proceedings of the 13th Design Automation Conference, 1976, pp. 214-224; Carl Sechen and Alberto Sangiovanni-Vincentelli, *The TimberWolf Placement and Routing Package*, IEEE Journal of Solid-State Circuits, 1985, pp. 510-522.

One scheme in the prior art describes an automatic partitioning and placement system which makes use of circuit structure and hierarchical design data in addition to the connectivity between circuit elements. See Gotaro Odawara, Takahisa Hiraide, and Osamu Nishina, *Partitioning and Placement Technique for CMOS Gate Arrays*, IEEE Transactions on Computer-aided Design, 1987, pp. 355-363. In this scheme, regular structures are extracted from a netlist and then treated as clusters in a placement algorithm. This method, however, requires a completely new placement scheme to handle the regular structures in the netlist. Further, the method is optimized for a hierarchical and structural netlist.

SUMMARY OF THE INVENTION

In accordance with the preferred embodiment of the present invention, a method is presented for placement of components for a VLSI circuit. In the method, control signal connection networks and data signal connection networks are identified. The control signal connection networks and data signal connection networks may be identified, for example, by a circuit designer. Alternately, the control signal connection networks and data signal connection networks may be identified using an extraction algorithm.

In the extraction algorithm used, for example, all the components of the VLSI circuit are initially included in a first set. A component from the first set is selected to be a first component. Components in the first set which belong to the same component type as the first component and which have an input connected, by an input connection network, to a similar type of input of the first component are placed in a first subset. If the first subset contains more than a single component, an input network which is connected to an input of the first component and a similar type of input of a greatest number of other components in the first subset is identified as a control signal connection network. The first component and the other components in the first subset which have inputs connected to the control signal connection network are grouped together. The components within the grouping are removed from the first set. This is repeated until there are no more components in the first set.

A second set is made of all the groupings. A first grouping from the second set is selected. Each connection network that is connected in a bundled fashion to at least one other connection network between the first grouping and any other grouping in the second set is identified as a data signal connection network. The first grouping is then removed from the second set. This process is repeated until there are no more groupings in the second set.

Once the control signal connection networks and data signal connection networks have been identified, an initial placement of the components for the VLSI circuit is made. This initial placement is then iteratively improved. The algorithm used for the iterative improvement has a cost metric in which a horizontal component for length of a connection network and a vertical component for length of the connection network are weighted differently dependent on whether the connection network was identified as a control signal connection network or a data signal connection network.

For example, the algorithm used for the iterative improvement may have a cost metric which has the following form:

$$\text{Cost}_D = \Sigma_D F(M_1 \cdot L_{vertical} + M_2 \cdot L_{horizontal})$$

$$\text{Cost}_C = \Sigma_C F(N_1 \cdot L_{vertical} + N_2 \cdot L_{horizontal})$$

where $\text{Cost}_D$ is a calculated cost for data signal connection networks, $\Sigma_D$ indicates a sum of all or a selected portion of data signal connection networks, F indicates a function for calculating a cost metric for a single connection network, $L_{vertical}$ is a vertical length of a particular connection network, $L_{horizontal}$ is a horizontal length of the particular connection network, $M_1$ and $M_2$ are multipliers respectively of $L_{vertical}$ and $L_{horizontal}$, $\text{Cost}_C$ is a calculated cost for control signal connection networks, $\Sigma_C$ indicates a sum of all or a selected portion of control signal connection networks, and $N_1$ and $N_2$ are multipliers respectively of $L_{vertical}$ and $L_{horizontal}$.

Once the placement and iterative improvement of placement is performed, the connection networks of the circuit are routed. The improved regularity of the placement of components based on the above described cost metrics allows for a simpler and more efficient routing of the connection networks between the components.

DESCRIPTION OF THE PREFERRED EMBODIMENT

The present invention concerns placement of components for a VLSI circuit which includes data path structures. The logical circuitry and connections for a VLSI circuit is typically generated in the form of a netlist. The netlist includes logical components and connection networks between the logical components. Once a netlist is generated for a VLSI circuit, the placement of the components needs to be performed.

Figure 1:
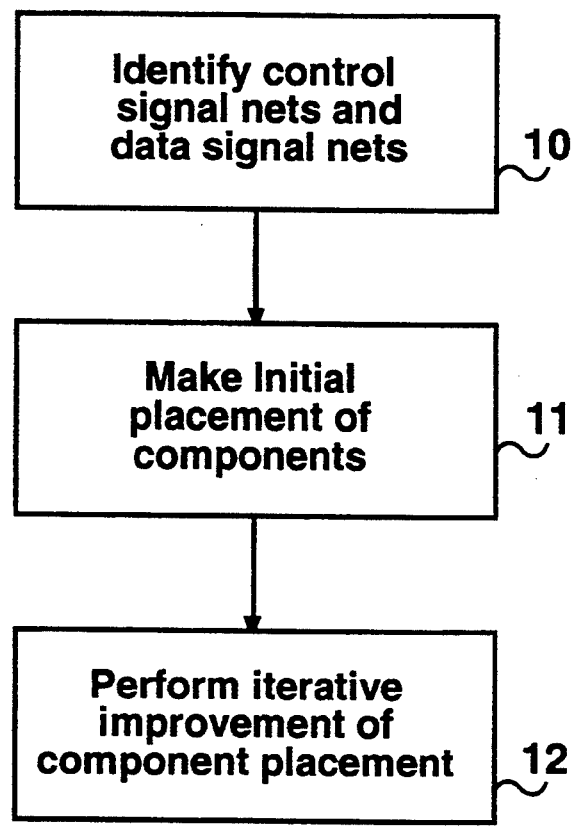
FIG. 1 shows a block flowchart which illustrates the placement of circuit components in accordance with the preferred embodiment of the present invention.

FIG. 1 is a flowchart which illustrates the placement of circuit components in accordance with the preferred embodiment of the present invention. In a step 10, control signal connection networks and data signal connection networks of data path structures are identified and distinguished from each other. This may be done either by identification by the designer or by use of an extraction algorithm.

Data signal connection networks are connection networks through which data flows. These include, for example, bus structures and other structures through which data flow. Control signal connection networks, on the other hand, are used to control data flow through data signal connection networks.

Figure 2:
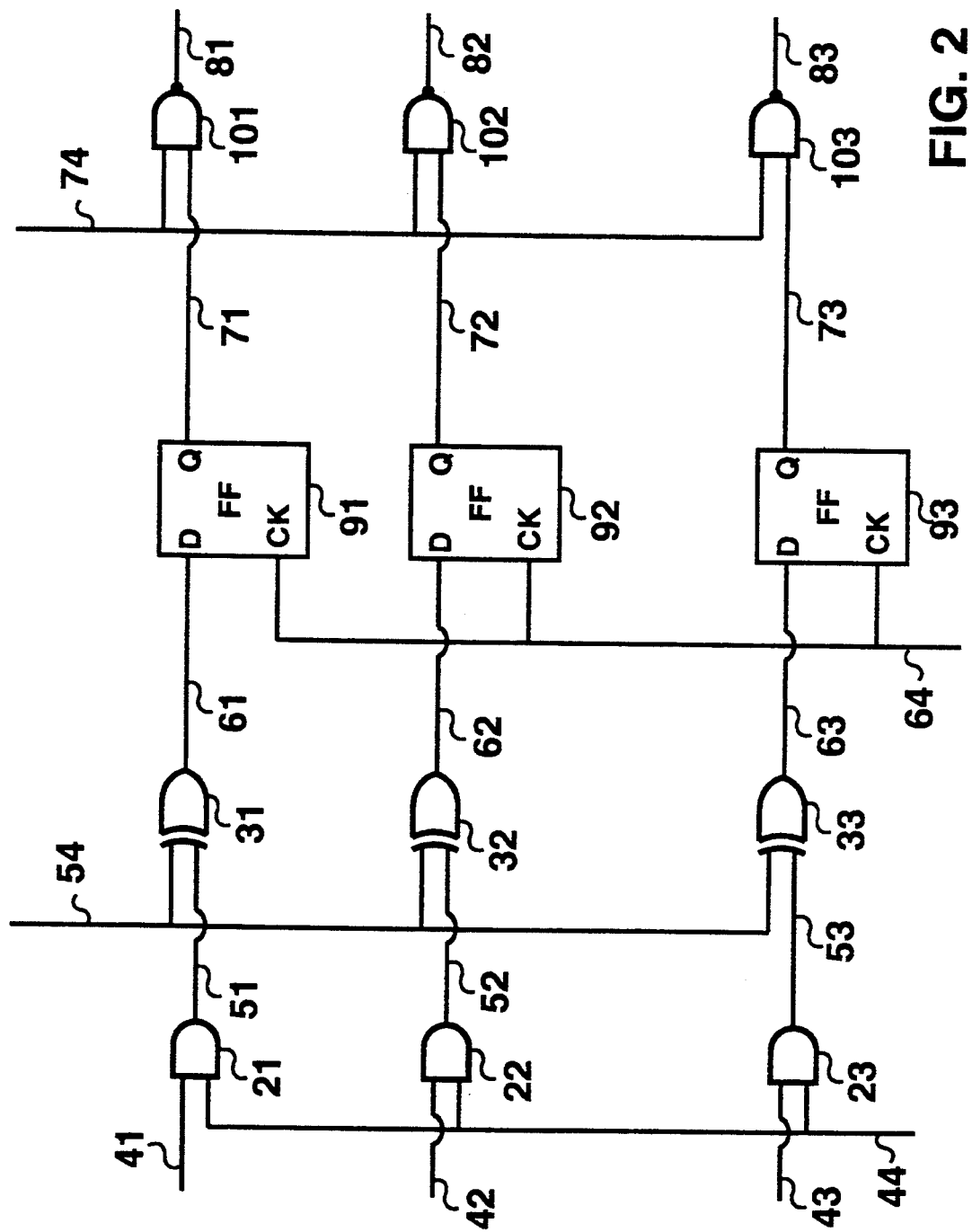
FIG. 2 shows a circuit used to illustrate the method described in flowchart shown in FIG. 1 in accordance with the preferred embodiment of the present invention.

For example, FIG. 2 shows data flow through data signal connection networks being controlled by control signal connection networks. Data on a data signal connection network 41 flows through a logical AND gate component 21 to a data signal connection network 51. Data on data signal connection network 51 flows through a logical XOR gate component 31 to a data signal connection network 61. Data on data signal connection network 61 flows through a logical flip-flop component 91 to a data signal connection network 71. Data on data signal connection network 71 flows through a logical NAND gate component 101 to a data signal connection network 81.

Similarly, data on a data signal connection network 42 flows through a logical AND gate component 22 to a data signal connection network 52. Data on data signal connection network 52 flows through a logical XOR gate component 32 to a data signal connection network 62. Data on data signal connection network 62 flows through a logical flip-flop component 92 to a data signal connection network 72. Data on data signal connection network 72 flows through a logical NAND gate component 102 to a data signal connection network 82.

Also, data on a data signal connection network 43 flows through a logical AND gate component 23 to a data signal connection network 53. Data on data signal connection network 53 flows through a logical XOR gate component 33 to a data signal connection network 63. Data on data signal connection network 63 flows through a logical flip-flop component 93 to a data signal connection network 73. Data on data signal connection network 73 flows through a logical NAND gate component 103 to a data signal connection network 83.

Data flow through logical AND gate components 21, 22 and 23 is controlled by a control signal connection network 44. Data flow through logical XOR gate components 31, 32 and 33 is controlled by a control signal connection network 54. Data flow through logical flip-flop components 91, 92 and 93 is controlled by a control signal connection network 44. Data flow through logical NAND gate components 101, 102 and 103 is controlled by a control signal connection network 74.

While a designer may designate the control signal connection networks and the data signal connection networks, these may also be extracted using an extraction algorithm. For example, below is a pseudo-code extraction algorithm for extracting control signal connection networks:

Algorithm 1

(1) Include in a set S all components of the VLSI circuit.

(2) Select a component from set S to be a first component.

(3) Place in a first subset components in set S which belong to a same component type as the first component and which have an input connected to a similar type of input of the first component by an input connection network.

(4) If the first subset formed in step (3) contains more than a single component, identify as a control signal connection network, an input network which is connected to an input of the first component and a similar type of input of a greatest number of other components in the first subset.

(5) Group together the first component and the other components in the first subset which have inputs connected to the control signal connection network identified in step (4).

(6) Remove from set S the components with the grouping formed in step (5).

(7) If there are still components in the set S, repeat steps (2) to (7).

(8) End.

Similarly, once the above extraction algorithm has extracted control signal connection networks, data signal connection networks may be similarly extracted. For example, below is a pseudo-code extraction algorithm for extracting data signal connection networks:

Algorithm 2

(1) Form a set G of all groupings formed in step (5) of the prior extraction algorithm.

(2) Select a first grouping from set G.

(3) Identify as a data signal connection network each connection network that is connected in a bundled fashion with at least one other connection network between the first grouping and any other grouping in set G.

(4) Remove the first grouping from set G.

(5) If there are still groupings in set G, repeat steps (2) through (5).

(6) End.

For an example of a prior art extraction algorithm, see Gotaro Odawara, Takahisa Hiraide, and Osamu Nishina, *Partitioning and Placement Technique for CMOS Gate Arrays*, IEEE Transactions on Computer-aided Design, 1987, pp. 355–363, cited above.

Once the the control signal connection networks and the data signal connection networks have been designated or extracted, in a method step 11, an initial partitioning and placement of components is made. This may be done, for example, using a mincut algorithm. See for example, C. M. Fiduccia and R. M. Mattheyses, *A Linear-Time Heuristic for Improving Network Partitions*, Proceedings of the 19th Design Automation Conference, 1982, pp. 241–247, cited above.

Alternately, the initial placement may be done using a number of other methods, for example, a force directed method such as that discussed in Gotaro Odawara, Takahisa Hiraide, and Osamu Nishina, *Partitioning and Placement Technique for CMOS Gate Arrays*, IEEE Transactions on Computer-aided Design, 1987, pp. 355–363.

After initial partitioning and placement of components, in a method step 12, an iterative improvement of component placement may be performed. This iterative improvement may be performed using one of a number of different algorithms. For example, the improvement may be done using Steinberg's Algorithm, a Force-Directed Relaxation algorithm, a Force-Directed Interchange algorithm or a Force-Directed Pairwise Relaxation algorithm. See generally, Maurice Hanan, Peter K. Wolff, Sr. and Barbara J. Agule, *Some Experimental Results of Placement Techniques*, Proceedings of the 13th Design Automation Conference, 1976, pp. 214–224.

A critical issue in initial placement of components and iterative improvement of placement is the reduction of the length of connection lines between components. Connection lines take up space on an integrated circuit proportional to their length. Therefore, for most initial placement algorithms and for virtually all placement improvement algorithms a cost metric is calculated based on length of connection lines between components.

In the preferred embodiments of the present invention, cost metrics based on length of connection lines have a vertical component and a horizontal component. One reason for using a separate vertical and horizontal component is to take into account the orthogonal placement of connection lines on a VLSI circuit. However, in the present invention, the use of separate vertical and horizontal component in a cost metric may be further used to help regularize the placement of data path components. Specifically, by differently weighting the components of the data signal connection networks and/or the control signal networks, the data signal connection networks can be given a propensity to flow in a first direction while the control signal connection networks can be given a propensity to flow in a second direction.

For example, a cost metric for an initial placement algorithm or a placement improvement algorithm will generally have a formula of the form of formula 1 below:

Formula 1

$$\text{Cost} = \Sigma F(L_{vertical} + L_{horizontal})$$

In formula 1 above, "Cost" is the calculated cost for the cost metric. "$\Sigma$" indicates that the cost is a sum of all or a selected portion of connection networks. "F" indicates a function for calculating a cost metric for a single connection network. The function may be a simple multiplier or a more complicated function. "$L_{vertical}$" the vertical length of a particular connection network. "$L_{horizontal}$" is the horizontal length of the particular connection network.

In the present invention, the cost metric of Formula 1 above is modified in order to regularize the placement of data paths. This is done by weighting the vertical and horizontal components differently for data signal connection networks and control signal connection networks. Specifically, this may be done using the separate cost metrics for data signal connection networks and control signal connection networks of the form given by formula 2 below:

Formula 2

$$\text{Cost}_D = \Sigma_D F(M_1 \cdot L_{vertical} + M_2 \cdot L_{horizontal})$$

$$\text{Cost}_C = \Sigma_C F(N_1 \cdot L_{vertical} + N_2 \cdot L_{horizontal})$$

In formula 2 above, "$\text{Cost}_D$" is the calculated cost for the cost metric for data signal connection networks. "$\Sigma_D$" indicates that the cost is a sum of all or a selected portion of data signal connection networks. "F" indicates a function for calculating a cost metric for a single connection network. "$L_{vertical}$" is the vertical length of a particular connection network. "$L_{horizontal}$" is the horizontal length of the particular connection network. "$M_1$" and "$M_2$" are multipliers respectively of "$L_{vertical}$" and "$L_{horizontal}$". Similarly "$\text{Cost}_C$" is the calculated cost for the cost metric for control signal connection networks. "$\Sigma_C$" indicates that the cost is a sum of all or a selected portion of control signal connection networks. "$N_1$" and "$N_2$" are multipliers respectively of "$L_{vertical}$" and "$L_{horizontal}$".

Using the above cost metrics it is possible to make the placement of data path components more regular. For example, in order to give data flow through data signal connection networks a propensity to flow in a horizontal direction and to give control signal flow through control signal connection networks a propensity to flow in a vertical direction, it is necessary only to make $M_1$ greater than $M_2$, and to make $N_1$ less than $N_2$. Similarly, in order to give data flow through data signal connection networks a propensity to flow in a vertical direction and to give control signal flow through control signal connection networks a propensity to flow in a horizontal direction, it is necessary only to make $M_1$ less than $M_2$, and to make $N_1$ greater than $N_2$.

Generally, the greater the difference between the value of $M_1$ and $M_2$, and between the value of $N_1$ and $N_2$, the greater the regularity of the circuit. However, as the difference between the values of $M_1$ and $M_2$, and between $N_1$ and $N_2$ increase, the overall efficiency of placement of the circuit tends to degrade. Therefore, it is necessary to tune the values of $M_1$, $M_2$, $N_1$ and $N_2$ to obtain the optimal value for each type of design. Selection of optimal values for $M_1$, $M_2$, $N_1$ and $N_2$ vary widely dependent upon the particular initial placement algorithm or iterative improvement algorithm, the type of integrated circuit and the actual circuitry.

Once the placement and iterative improvement of placement is performed, the connection networks of the circuit are routed. The improved regularity of the placement of components based on the above described cost metrics allows for a simpler and more efficient routing of the connection networks between the components.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for placement of components for a VLSI circuit, the method comprising the steps of:
   (a) identifying control signal connection networks and data signal connection networks;
   (b) making an initial placement of the components for the VLSI circuit; and,
   (c) iteratively improving the initial placement of the components for the VLSI circuit using an algorithm having a cost metric in which a horizontal component for length of a connection network and a vertical component for length of the connection network are weighted differently dependent on whether in step (a) the connection network was identified as a control signal connection network or a data signal connection network.

2. A method as in claim 1 wherein step (b) is performed using an algorithm having a cost metric in which a horizontal component for length of a connection network and a vertical component for length of the connection network are weighted differently dependent on whether in step (a) the connection network was identified as a control signal connection network or a data signal connection network.

3. A method as in claim 2 wherein the cost metric used in step (b) has a form $$Cost_D = \Sigma_D F(M_1 \cdot L_{vertical} + M_2 \cdot L_{horizontal})$$

$$Cost_C = \Sigma_C F(N_1 \cdot L_{vertical} + N_2 \cdot L_{horizontal})$$

where $Cost_D$ is a calculated cost for data signal connection networks, $\Sigma_D$ indicates a sum of all or a selected portion of data signal connection networks, F indicates a function for calculating a cost metric for a single connection network, $L_{vertical}$ is a vertical length of a particular connection network, $L_{horizontal}$ is a horizontal length of the particular connection network, $M_1$ and $M_2$ are multipliers respectively of $L_{vertical}$ and $L_{horizontal}$, $Cost_C$ is a calculated cost for control signal connection networks, $\Sigma_C$ indicates a sum of all or a selected portion of control signal connection networks, and $N_1$ and $N_2$ are multipliers respectively of $L_{vertical}$ and $L_{horizontal}$.

4. A method as in claim 1 wherein in step (a) control signal connection networks and data signal connection networks are identified by a circuit designer.

5. A method as in claim 4 wherein in step (a) control signal connection networks and data signal connection networks are identified using an extraction algorithm.

6. A method as in claim 5 wherein in step (a) the extraction algorithm performs in accordance with the following method substeps:
   (a.1) including in a first set all components of the VLSI circuit;
   (a.2) selecting a component from the first set to be a first component;
   (a.3) placing in a first subset, components in the first set which belong to a same component type as the first component and which have an input connected, by an input connection network, to a similar type of input of the first component;
   (a.4) if the first subset formed in substep (a.3) contains more than a single component, identifying as a control signal connection network, an input network which is connected to an input of the first component and a similar type of input of a greatest number of other components in the first subset;
   (a.5) grouping together the first component and the other components in the first subset which have inputs connected to the control signal connection network identified in substep (a.4);
   (a.6) removing from the first set the components within the grouping formed in substep (a.5);
   (a.7) if there are still components in the first set, repeating substeps (a.2) to (a.7);
   (a.8) forming a second set of all groupings formed in substep (a.5);
   (a.9) selecting a first grouping from the second set;
   (a.10) identifying as a data signal connection network each connection network that is connected in a bundled fashion with at least one other connection network between the first grouping and any other grouping in the second set;
   (a.11) removing the first grouping from the second set; and,
   (a.12) if there are still groupings in the second set, repeating substeps (a.9) through (a.12).

7. A method as in claim 1 wherein the cost metric used in step (c) has a form $$Cost_D = \Sigma_D F(M_1 \cdot L_{vertical} + M_2 \cdot L_{horizontal})$$

$$Cost_C = \Sigma_C F(N_1 \cdot L_{vertical} + N_2 \cdot L_{horizontal})$$

where $Cost_D$ is a calculated cost for data signal connection networks, $\Sigma_D$ indicates a sum of all or a selected portion of data signal connection networks, F indicates a function for calculating a cost metric for a single connection network, $L_{vertical}$ is a vertical length of a particular connection network, $L_{horizontal}$ is a horizontal length of the particular connection network, $M_1$ and $M_2$ are multipliers respectively of $L_{vertical}$ and $L_{horizontal}$, $Cost_C$ is a calculated cost for control signal connection networks, $\Sigma_C$ indicates a sum of all or a selected portion of control signal connection networks, and $N_1$ and $N_2$ are multipliers respectively of $L_{vertical}$ and $L_{horizontal}$.

8. A method as in claim 7 wherein in step (a) control signal connection networks and data signal connection networks are identified by a circuit designer.

9. A method as in claim 8 wherein in step (a) control signal connection networks and data signal connection networks are identified using an extraction algorithm.

10. A method as in claim 9 wherein in step (a) the extraction algorithm performs in accordance with the following method substeps:
    (a.1) including in a first set all components of the VLSI circuit;
    (a.2) selecting a component from the first set to be a first component;
    (a.3) placing in a first subset, components in the first set which belong to a same component type as the first component and which have an input connected, by an input connection network, to a similar type of input of the first component;
    (a.4) if the first subset formed in substep (a.3) contains more than a single component, identifying as a control signal connection network, an input network which is connected to an input of the first component and a similar type of input of a greatest number of other components in the first subset;

(a.5) grouping together the first component and the other components in the first subset which have inputs connected to the control signal connection network identified in substep (a.4);

(a.6) removing from the first set the components within the grouping formed in substep (a.5);

(a.7) if there are still components in the first set, repeating substeps (a.2) to (a.7);

(a.8) forming a second set of all groupings formed in substep (a.5);

(a.9) selecting a first grouping from the second set;

(a.10) identifying as a data signal connection network each connection network that is connected in a bundled fashion with at least one other connection network between the first grouping and any other grouping in the second set;

(a.11) removing the first grouping from the second set; and, (a.12) if there are still groupings in the second set, repeating substeps (a.9) through (a.12).

* * * * *